(12) United States Patent
Yoshioka et al.

(10) Patent No.: US 7,221,176 B2
(45) Date of Patent: May 22, 2007

(54) VACUUM PROBER AND VACUUM PROBE METHOD

(75) Inventors: Haruhiko Yoshioka, Nirasaki (JP); Kiyoshi Takekoshi, Nirasaki (JP); Shinjiro Watanabe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/078,305

(22) Filed: Mar. 14, 2005

(65) Prior Publication Data

US 2005/0206396 A1 Sep. 22, 2005

(30) Foreign Application Priority Data

Mar. 16, 2004 (JP) ............... 2004-074357

(51) Int. Cl.
*G01R 31/02* (2006.01)
(52) U.S. Cl. .................................... 324/758
(58) Field of Classification Search ................ None
See application file for complete search history.

(56) References Cited

U.S. PATENT DOCUMENTS

| | | | | |
|---|---|---|---|---|
| 4,532,423 A | * | 7/1985 | Tojo et al. ................. | 250/310 |
| 5,550,482 A | | 8/1996 | Sano | |
| 6,124,725 A | * | 9/2000 | Sato .......................... | 324/765 |
| 6,194,907 B1 | | 2/2001 | Kanao et al. | |
| 6,404,212 B1 | * | 6/2002 | Mehta et al. ............... | 324/754 |
| 6,535,004 B2 | * | 3/2003 | Mehta et al. ............... | 324/754 |
| 6,545,458 B2 | * | 4/2003 | Yamazaki ................. | 324/158.1 |
| 6,744,268 B2 | * | 6/2004 | Hollman .................... | 324/758 |
| 2004/0257101 A1 | * | 12/2004 | Miura et al. ............... | 324/758 |
| 2005/0151549 A1 | * | 7/2005 | Okumura et al. .......... | 324/756 |

FOREIGN PATENT DOCUMENTS

| | | |
|---|---|---|
| JP | 7-37945 | 2/1995 |
| JP | 2000-260839 | 9/2000 |
| JP | 2004-128202 | 4/2004 |

* cited by examiner

*Primary Examiner*—Ha Tran Nguyen
*Assistant Examiner*—Richard Isla-Rodas
(74) *Attorney, Agent, or Firm*—Oblon, Spivak, McClelland, Maier & Neustadt, P.C.

(57) ABSTRACT

In a vacuum prober, a head plate is arranged on a prober chamber. A stage, first moving mechanism, recessed chamber, and sealing member are provided in the prober chamber. The stage is arranged below a probe card. The first moving mechanism vertically moves the stage in at least the Z direction. The recessed chamber has a bottom portion and side portion. A lower camera, an upper camera, and the stage are operated to obtain data for alignment. When the upper end of the side portion of the recessed chamber comes into tight contact with the lower surface of the sealing member and a vacuum mechanism evacuates the recessed chamber, a vacuum chamber is formed. As the chamber has a small capacity, the time required for evacuation can be shortened.

12 Claims, 13 Drawing Sheets

VACUUM PROBER AND VACUUM PROBE METHOD

CROSS-REFERENCE TO RELATED APPLICATIONS

This application is based upon and claims the benefit of priority from prior Japanese Patent Application No. 2004-074357, filed Mar. 16, 2004, the entire contents of which are incorporated herein by reference.

BACKGROUND OF THE INVENTION

1. Field of the Invention

The present invention relates to a vacuum prober and vacuum probe method which test the electrical characteristics of an object to be tested in a vacuum environment.

2. Description of the Related Art

In a process of manufacturing a semiconductor device, a probe system is used to test the electrical characteristics of a device formed on a wafer in a vacuum environment.

Patent reference 1 (Jpn. Pat. Appln. KOKAI Publication No. 2000-260839) discloses a low-temperature testing device in which a so-called prober chamber is entirely used as a vacuum vessel. In this low-temperature testing device, the entire prober chamber must be evacuated to produce a vacuum environment. Accordingly, evacuation takes time. Patent reference 1 discloses nothing concerning shortening of the evacuation time. Patent reference 1 does not disclose an alignment technique for a sample and probe needles, either.

Patent reference 2 (Jpn. Pat. Appln. KOKAI Publication No. 7-37945) discloses the following prober having an alignment mechanism. A container for accommodating a table and a multilevel interconnection substrate having a pump, the container is formed to be dividable into a cover portion and base portion. An optical unit integrally having upper and lower cameras is introduced between the cover and base portions, to image probes and electrode pads of an object to be tested. This prober, however, is not a vacuum prober that performs testing in a vacuum environment as in the present invention. This prober employs the optical unit which integrally has the upper and lower cameras. Such an optical unit has a complicated structure, and the focusing mechanisms of the two cameras require a specific contrivance.

Patent reference 3 (Jpn. Pat. Appln. KOKAI Publication No. 2004-128202) describes a prober in which a vacuum chamber is arranged in a prober chamber. A table is arranged in the vacuum chamber to test the electrical characteristics of a device in the vacuum chamber.

In this prober, however, the table cannot be moved in the X, Y, and Z directions in the vacuum chamber. To test the electrical characteristics of a plurality of devices formed on one wafer, steps of formation of an atmospheric environment→formation of a vacuum environment→testing must be repeated for the respective devices, leading to low throughput.

BRIEF SUMMARY OF THE INVENTION

It is an object of the present invention to solve at least one of the problems of the prior art. In particular, it is an object of one embodiment of the present invention to solve at least one of the problem of testing the electrical characteristics of a plurality of objects to be tested in a once-formed vacuum environment without repeating the steps of formation of an atmospheric environment→formation of a vacuum environment→testing for the plurality of objects to be tested, the problem of decreasing the internal capacity of the vacuum chamber in the vacuum prober, and the problem of shortening an exhaust time required to evacuate the vacuum chamber.

(I) According to a first aspect of the present invention, there is provided a vacuum prober for testing electrical characteristics of an object to be tested in a vacuum environment while respective contacts are in contact with predetermined electrodes of the object to be tested. This vacuum prober comprises:

a prober main body;

a recessed chamber arranged in the prober main body;

a table which is arranged in the recessed chamber and upon which an object to be tested is placed;

a lower camera arranged either inside or outside the recessed chamber; and an upper camera arranged at one of a position outside the recessed chamber and a position to oppose an interior of the recessed chamber, wherein the lower camera, while being positioned below the contacts, images the contacts, and the upper camera, while being positioned above the table in the recessed chamber, images the object to be tested.

(I.1) An upper camera in the vacuum prober according to (I) can be arranged outside a recessed chamber.

(I.2) A vacuum prober according to (I.1), in which the recessed chamber which includes a bottom portion and a side portion, and which further includes:

a sealing member which is independent of the recessed chamber to seal an upper opening of the recessed chamber;

a first moving mechanism which moves the recessed chamber in a Z direction; and a vacuum mechanism connected to the recessed chamber, wherein when the first moving mechanism moves the recessed chamber in the Z direction to bring an upper end of the side portion of the recessed chamber into tight contact with a surface of the sealing member, the recessed chamber becomes a sealed chamber, and when a vacuum mechanism evacuates the sealed chamber, the sealed chamber becomes a vacuum chamber.

(I.3) A vacuum prober according to (I.2), further comprising a fourth moving mechanism which moves the recessed chamber in the Z direction to separate the upper end of the side portion of the recessed chamber from the surface of the sealing member, thereby forming a gap between the upper end of the side portion and the sealing member, and moves the upper camera from outside into the recessed chamber through the gap.

(I.4) A vacuum prober according to (I.2), which further comprises a second moving mechanism which moves the table in at least one of X, Y and θ directions in the vacuum chamber, and in which the lower camera is provided on one of the table and second moving mechanism.

(I.5) A vacuum prober according to (I.2), which further comprises a stage which supports the recessed chamber, and in which the first moving mechanism moves the stage in the Z direction to move the recessed chamber on the stage in the Z direction.

(I.6) A vacuum prober according to (I.5), wherein the stage also serves as the bottom portion of the recessed chamber.

(I.7) A vacuum prober according to (I.2), further comprising:
a contact holding mechanism which is arranged on an upper portion of the prober main body and includes a plurality of contacts; and
a third moving mechanism which vertically moves the contact holding mechanism,
wherein the contact holding mechanism and third moving mechanism are hermetically attached to the sealing member.

(I.8) A vacuum prober according to (I.2), wherein the lower camera is fixed to an outer wall of the recessed chamber.

(I.9) A vacuum prober according to (I.8), further comprising a first moving mechanism configured to move the recessed chamber in the X, Y, and Z directions,
wherein the first moving mechanism moves the recessed chamber in the Z direction to create a state wherein the upper end of the side portion of the recessed chamber is separate from the surface of the sealing member, and thereafter moves the recessed chamber in at least the X and Y directions to position the lower camera, fixed outside the recessed chamber, below the upper camera.

(I.10) A vacuum prober according to (I.9), wherein the stage also serves as the bottom portion of the recessed chamber.

(I.11) A vacuum prober according to (I.9), which further comprises a stage which supports the recessed chamber, and in which the first moving mechanism moves the stage in the Z direction to move the recessed chamber on the stage in the Z direction.

(I.12) A vacuum prober according to (I.10), further comprising:
a contact holding mechanism which is arranged on an upper portion of the prober main body and includes a plurality of contacts; and
a third moving mechanism which vertically moves the contact holding mechanism,
wherein the contact holding mechanism and third moving mechanism are hermetically attached to the sealing member.

(II) In a vacuum prober according to (I.3), a vacuum probe method of testing the electrical characteristics of the object to be tested in a vacuum environment, the vacuum probe method comprising steps of:
(a) separating the recessed chamber from the sealing member and placing the object to be tested on the table;
(b) moving the upper camera into the recessed chamber while the recessed chamber and sealing member are separate from each other;
(c) measuring a position of the upper camera by the lower camera;
(d) obtaining X-, Y-, and Z-coordinates of the object to be tested placed on the table by using the upper camera;
(e) retreating the upper camera upward outside the recessed chamber;
(f) bringing the upper opening of the recessed chamber and the sealing member into tight contact with each other to form a sealed chamber;
(g) obtaining X-, Y-, and Z-coordinates of the contacts by using the lower camera;
(h) evacuating the sealed chamber by a vacuum mechanism to obtain a vacuum chamber;
(i) electrically connecting the contacts and electrodes of the object to be tested to each other in the vacuum chamber;
(j) testing the electrical characteristics of the object to be tested;
(k) moving the contacts upward, moving the table to the next test position, and moving the contacts downward again; and
(l) repeating steps (i) to (k) to sequentially measure the electrical characteristics of objects to be tested,
wherein steps (b), (c), (d), (e), (f), and (g) are performed in accordance with any one of the order of (b), (c), (d), (e), (f), and (g), the order of (b), (c), (e), (f), (g), (b), (d), and (e), the order of (b), (d), (c), (e), (f), and (g), and the order of (b), (d), (e), (f), (g), (b), (c), (e), and (f).

(III) In a vacuum prober according to (I.8), a vacuum probe method of testing the electrical characteristics of the object to be tested in a vacuum environment, the vacuum probe method comprising steps of:
(a) separating the recessed chamber from the sealing member and placing the object to be tested on the table;
(b) moving the lower camera to be positioned below the upper camera;
(c) determining positions of optical axes of the upper and lower cameras;
(d) moving the table to below the upper camera and obtaining a position of the object to be tested placed on the table by using the upper camera;
(e) moving the recessed chamber to position the lower camera below the contacts;
(f) obtaining X- and Y-coordinates of the contacts by using the lower camera;
(g) moving the recessed chamber to position the table below the contacts;
(h) bringing the upper opening of the recessed chamber and the sealing member into tight contact with each other to form a sealed chamber;
(i) evacuating the sealed chamber by a vacuum mechanism to obtain a vacuum chamber;
(j) electrically connecting the contacts and electrodes of the object to be tested to each other in the vacuum chamber;
(k) testing the electrical characteristics of the object to be tested;
(l) moving the contacts upward, moving the table to the next test position, and moving the contacts downward again; and
(m) repeating steps (j) to (l) to sequentially measure the electrical characteristics of objects to be tested,
wherein steps (b), (c), (d), (e), and (f) are performed in accordance with any one of the order of (b), (c), (d), (e), and (f), the order of (b), (c), (e), (f), and (d), the order of (d), (b), (c), (e), and (f), and the order of (d), (e), (f), (b), and (c).

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
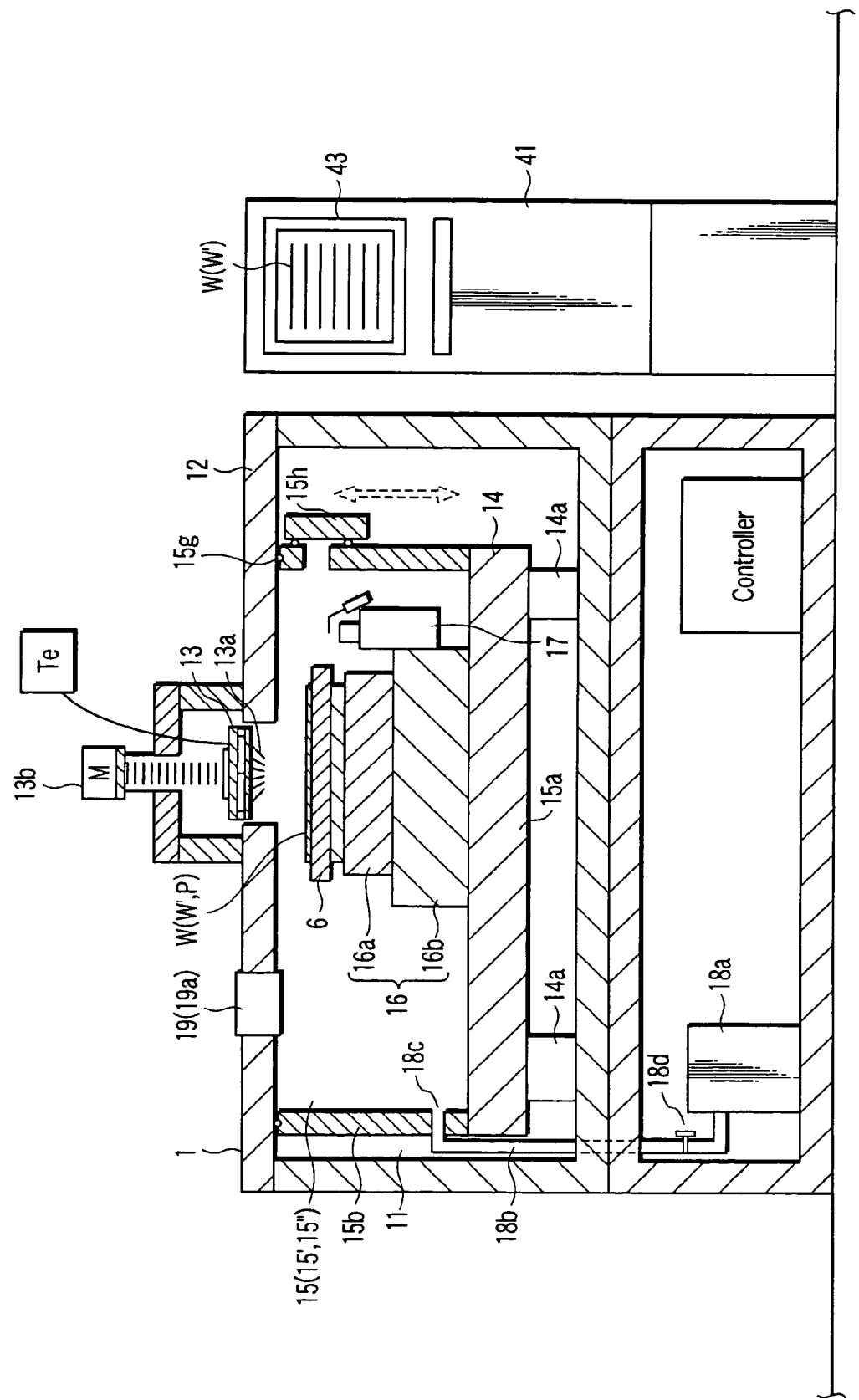
FIG. 1 is a sectional view showing a vacuum prober according to a first embodiment of the present invention.

The present invention is directed to a vacuum prober 1 for testing the electrical characteristics of an object W' to be tested in a vacuum environment. The object W' to be tested can be electrical components and electrical products in general, and is not particularly limited. Typically, the vacuum prober 1 tests the electrical characteristics of general electrical elements and electrical products such as a semiconductor element formed on a wafer W, an imaging element formed on a silicon wafer, and a liquid crystal panel.

A vacuum prober according to a first embodiment of the present invention will be described with reference to FIG. 1. A vacuum probe 1 system shown in FIG. 1 can have a loader device 41 and prober 1. The loader device 41 stores and transports a wafer W. The prober 1 tests the electrical characteristics of the wafer W moved from the loader device 41. The loader device 41 can include a subchuck. The subchuck prealigns the wafer W with reference to an orientation flat or notch of the wafer W while transporting the wafer W to the vacuum prober 1.

A stage 14 is arranged in a prober chamber 11 of the vacuum prober 1. A first moving mechanism 14a vertically moves the stage 14 in the Z direction.

A recessed chamber 15 is formed on the stage 14. A table 6, X-Y moving mechanism 16b, θ rotary mechanism 16a, lower camera 17, exhaust port 18c of a pipe 18b, and valve 18d are arranged in the recessed chamber 15. The wafer W transported from the loader device 41 is to be placed on the table 6. The X-Y moving mechanism 16 moves the table 6 in the X and Y directions. The θ rotary mechanism 16a rotates the table 6 in the θ direction. The lower camera 17 images upward. The pipe 18b is connected to a vacuum mechanism (e.g., a vacuum pump; the vacuum mechanism will be referred to as the vacuum pump hereinafter) 18a. The lower camera 17 moves in the X and Y directions together with the table 6.

A probe card 13, third moving mechanism 13b, alignment bridge 19a, and an upper camera 19 are arranged on the upper portion of the prober chamber 11. The probe card 13 has a plurality of probes 13a. The third moving mechanism 13b vertically moves the probe card 13. The upper camera 19 images downward. In this manner, the upper camera 19 is arranged at a position where it opposes the interior of the recessed chamber 15.

The third moving mechanism 13b vertically moves the probe card 13 without disturbing the vacuum in a vacuum chamber 15".

The upper and lower cameras 19 and 17 constitute alignment mechanisms which accurately align the plurality of probes 13a of the probe card 13 and the plurality of electrode P pads on the wafer W with each other. The probe card 13 is arranged above the table 6. The wafer W is placed on the table 6.

When the first moving mechanism 14a moves the stage 14 upward, the upper end 15g of a side portion 15b of the recessed chamber 15 comes into tight contact with the lower surface of a head plate 12. Then, the recessed chamber 15 becomes a sealed chamber 15'. When the sealed chamber 15' is evacuated by the vacuum pump 18a, it becomes the vacuum chamber 15".

The probe card 13 of the vacuum prober 1 shown in FIG. 1 can be electrically connected to a tester Te through a cable. A test signal from the tester Te is transmitted to the probes 13a through the cable.

The test signal is applied from the probes 13a to the electrodes P of an object to be tested (for example, device) W' formed on the wafer W. On the basis of the test signal, the tester Te tests the electrical characteristics of a plurality of devices W'.

To perform this testing, the probes 13a and the electrodes P of the object to be tested W' must be aligned with each other. This alignment will be described hereinafter.

First, in the vacuum chamber 15", the X-Y moving mechanism 16b positions the table 6 below the probe card 13. The lower camera 17 which moves together with the table 6 reaches a position below a predetermined probe 13a. The third moving mechanism 13b vertically moves the probe card 13 such that the needle point of the predetermined probe 13a of the probe card 13 is positioned at a focal point of the lower camera 17. The lower camera 17 images the needle point of the predetermined probe 13a. The X-, Y-, and Z-coordinates of the needle point of the probe 13a are calculated from the coordinates of the table 6 at this time.

Subsequently, the table 6 moves so that it is located below the upper camera 19. At this time, the lower camera 17 reaches a position under the upper camera 19. The upper and lower cameras 19 and 17 are focused on a target 17a, so that the optical axes of the two cameras 19 and 17 coincide with each other. The reference position of the table 6 is obtained from the position of the table 6 as the optical axes of the two cameras 19 and 17 coincide with each other.

After that, the table 6 moves below the upper camera 19, and the upper camera 19 images a predetermined electrode P of the object to be tested W' formed on the wafer W. The coordinates of the electrode P are calculated from the position of the table 6 at this time. The position of the table 6 is controlled on the basis of the coordinates of the probe 13a calculated in this manner and the coordinates of the electrode P of the object to be tested W' formed on the wafer W, to align the electrode P of the object to be tested W' with the probe 13*a*.

After the alignment, the electrical characteristics of the object to be tested W' formed on the wafer W are tested. More specifically, the table 6 moves to a position below the probe card 13. The table 6 moves upward to a Z-direction preset position (referred to as the "Z-direction alignment position" hereinafter) which is set in advance. The electrodes P of the object to be tested W' placed on the table 6 accordingly come into contact with the probes 13*a* of the probe card 13. The third moving mechanism 13*b* overdrives the probe card 13 to bring the probes 13*a* into contact with the electrodes P of the object to be tested W' with a predetermined needle pressure.

Through this contact, the probes 13*a* are electrically connected to the electrodes P. In this state, the tester Te sends a test signal to the electrodes P through the probes 13*a*, to test the electrical characteristics of the object to be tested W'. After the test, the probe card 13 moves upward, and the test for the object to be tested W' is ended.

The electrical characteristics of the next device W' on the wafer W can be tested by repeating the above steps while maintaining the vacuum environment in the vacuum chamber 15".

A vacuum prober 1 according to the second embodiment of the present invention will be described with reference to FIG. 2. In the vacuum prober 1, a vacuum chamber 15", a stage 14 for placing the vacuum chamber 15" thereon, and mechanisms relating to alignment are different from those of the conventional device described in patent reference 1. Other mechanisms such as a table 6 can be formed in the same manner as in the conventional device.

The stage 14 is arranged in a prober chamber 11. A first moving mechanism 14*a* vertically moves the stage 14 in the Z direction.

A contact holding mechanism 13 and upper camera 19 can be provided to the upper portion of the prober chamber 11. The contact holding mechanism 13 has a plurality of contacts 13*a*. The upper camera 19 images upward.

When probes 13*a* are employed as the contacts 13*a*, a probe card 13 can be employed as the contact holding mechanism 13 (in the following description, the contacts and the contact holding mechanism will be respectively referred to as "probes" and a "probe card"). In the first embodiment, a probe card 13 having a plurality of probes 13*a* is employed. The probe card 13 having the probes 13*a* is vertically moved in the Z direction by a third moving mechanism 13*b*.

Figure 3:
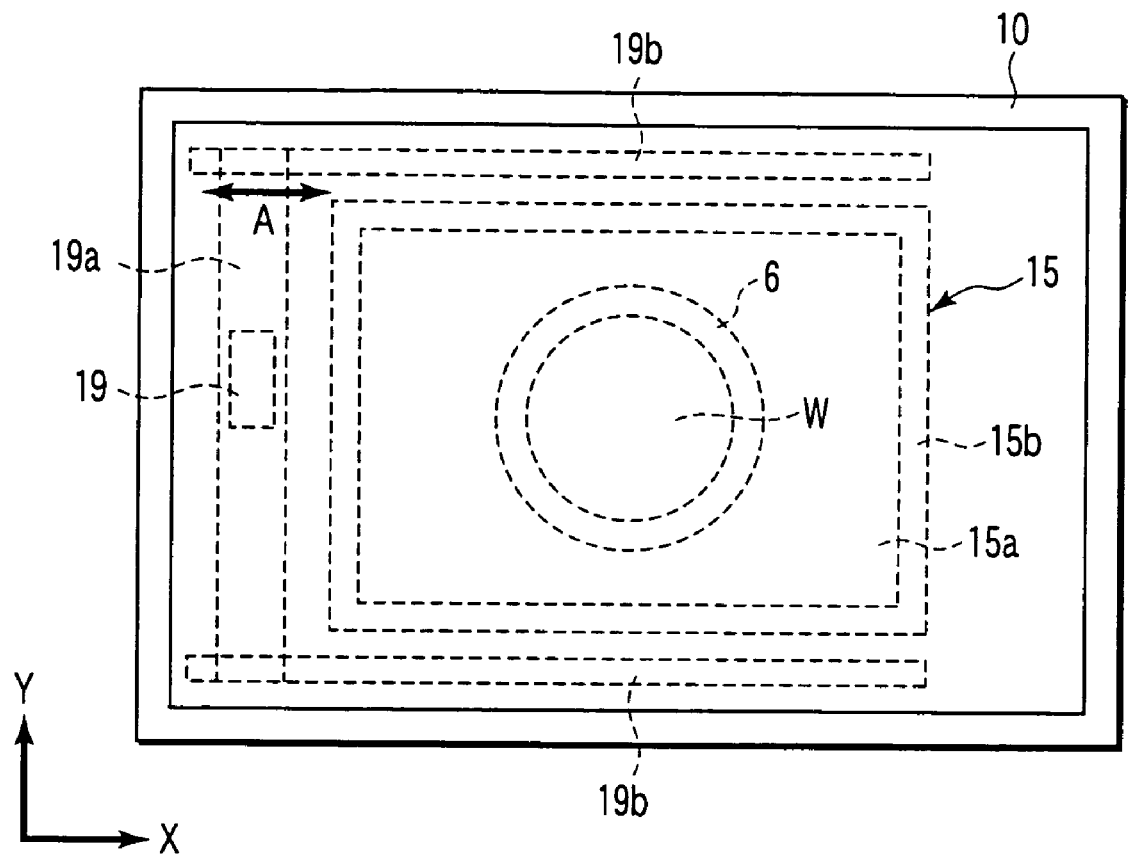
FIG. 3 is a view showing a moving mechanism for an upper camera that can be employed in the second embodiment of the present invention.

FIG. 3 shows an example of a fourth moving mechanism 19' to move the upper camera 19 in the X direction. An alignment bridge 19*a* can move in directions of arrows A along guides (e.g., LM guides) 19*b*. Accordingly, the upper camera 19 can move along the guides 19*b* in the X direction together with the alignment bridge 19*a*. As the forth moving mechanism 19' for the upper camera 19, any mechanism that can move the upper camera 19 accurately in the X direction can be employed.

Referring back to FIG. 2, a recessed chamber 15 is fixed on the stage 14. The recessed chamber 15 has a bottom portion 15*a* and side portion 15*b*. The bottom portion 15*a* of the vacuum prober 1 shown in FIG. 2 is fixed on the stage 14.

The table 6, a second moving mechanism 16, the lower camera 17, an exhaust port 18*c* of a pipe 18*b*, and an atmospheric open pipe 18*e* with a valve can be provided in the recessed chamber 15. A wafer W is to be placed on the table 6. The second moving mechanism 16 moves the table 6 in the X and Y directions and the θ direction. The lower camera 17 images upward. The pipe 18*b* is connected to a vacuum pump 18*a*. As the pipe 18*b*, one with stretchable, deformable structure (e.g., a bellows structure) can be employed. The lower camera 17 can be formed to move together with the table 6 in the X and Y directions.

The upper and lower cameras 19 and 17 constitute an alignment mechanism which accurately aligns the plurality of probes 13*a* of the probe card 13 and the plurality of electrodes P on the wafer W with each other. The probe card 13 is arranged above the table 6. The wafer W is placed on the table 6. The lower camera 17 is preferably one which can stand a vacuum environment.

Figure 5:
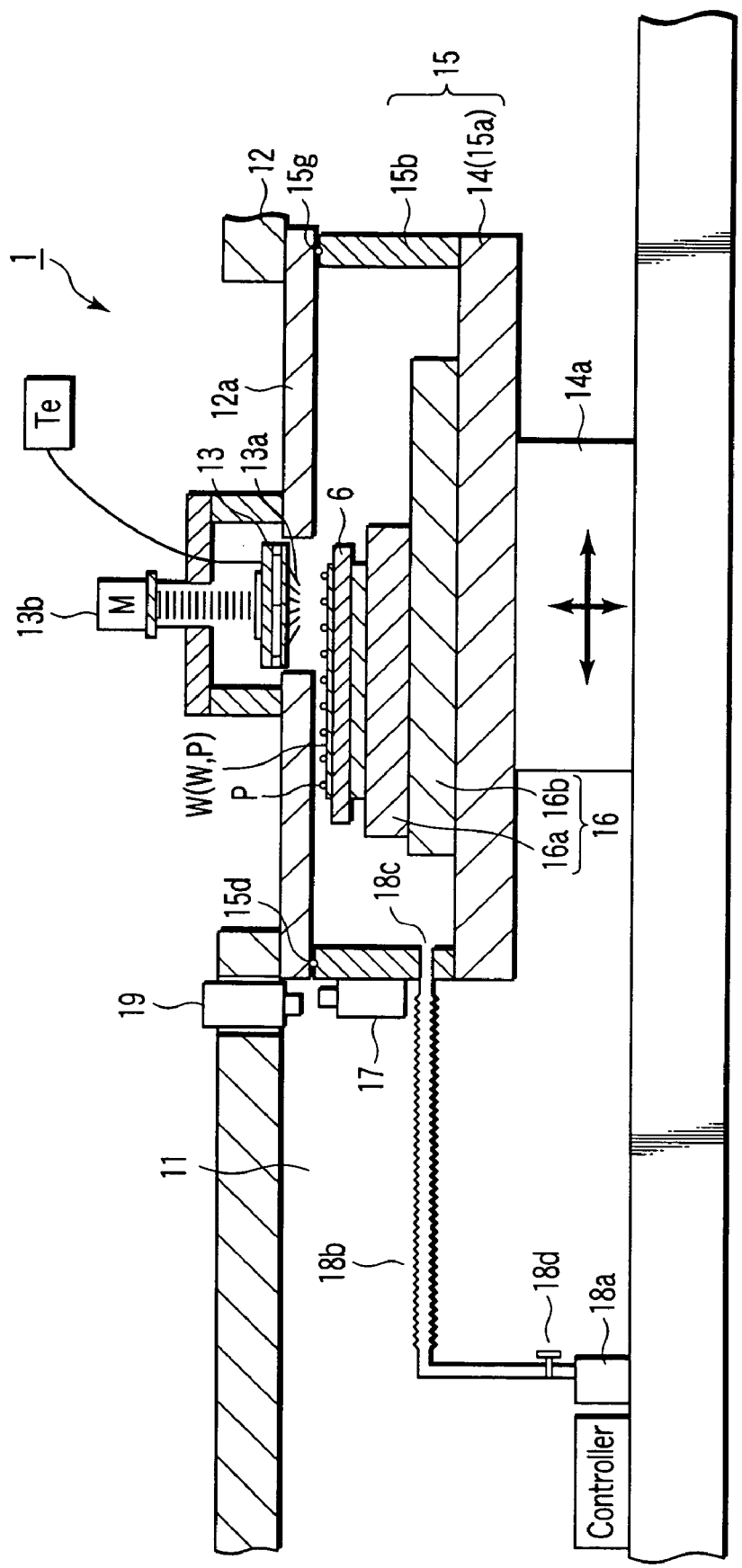
FIG. 5 is a sectional view showing a vacuum prober according to a third embodiment of the present invention.

When the first moving mechanism 14*a* moves the stage 14 upward, an upper end 15*g* of the side portion 15*b* of the recessed chamber 15 arranged on the stage 14 comes into tight contact with the lower surface of a sealing member 12*a*. A head plate 12 in the vacuum prober 1 shown in FIG. 2 also serves as the sealing member 12*a*. Alternatively, a sealing member 12*a* for the recessed chamber 15 can be arranged independently of the head plate 12, as shown in FIG. 5, or integrally with the head plate 12.

As the upper end 15*g* of the side portion 15*b* and the lower surface of the head plate 12 come into tight contact with each other, the recessed chamber 15 becomes a sealed chamber 15'. The sealed chamber 15' is evacuated by the vacuum pump 18*a* to become the vacuum chamber 15". In the vacuum chamber 15", the table 6 can move in the X and Y directions to perform testing. Thus, once the vacuum chamber 15" is formed, the electrical characteristics of all objects W' to be tested formed on one wafer W can be tested without destroying the vacuum in the vacuum chamber 15".

Figure 2:
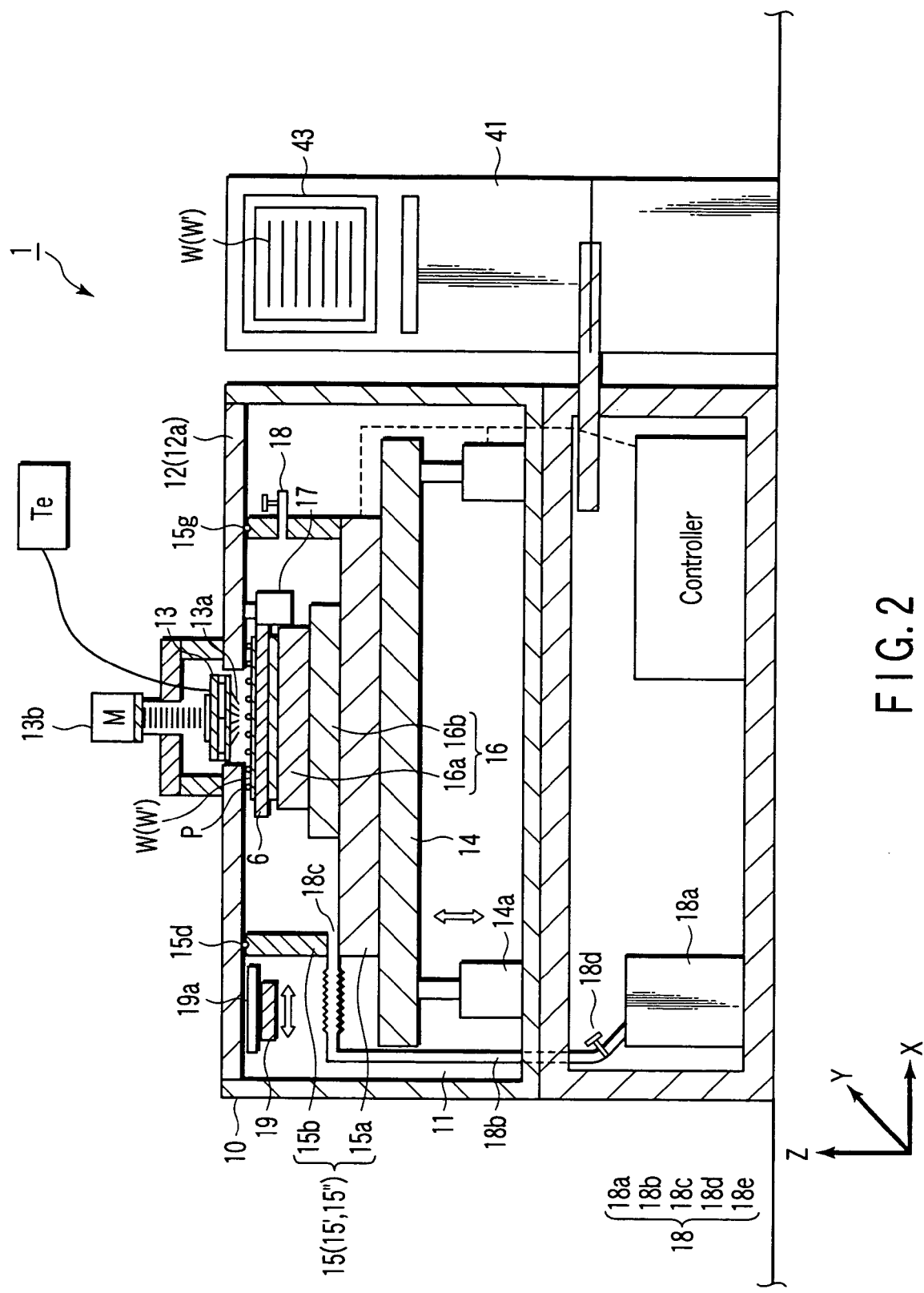
FIG. 2 is a sectional view showing a vacuum prober according to a second embodiment of the present invention.

In the vacuum prober 1 shown in FIG. 2, the upper end 15*g* of the side portion 15*b* is in direct tight contact with the lower surface of the head plate 12. This upper end 15*g* and/or the lower surface of the head plate 12 can be formed that they come into tighter contact with each other. According to an example of this structure, a shield mechanism 15*d* is arranged at a portion where the head plate 12 and the upper end 15*g* of the side portion 15*b* come into tight contact with each other. As the shield mechanism 15*d*, apart from an O-ring, any shield mechanism can be employed.

A test signal from a tester Te is transmitted to the probes 13*a* through a cable. The test signal is applied from the probes 13*a* to the electrodes P of a device W' formed on the wafer W. On the basis of the test signal, the tester Te tests the electrical characteristics of the plurality of objects to be tested W' formed on the wafer W.

To perform this test, the probes 13*a* and corresponding electrodes P on the objects W' to be tested must be aligned with each other. For the alignment, first, the reference position of the table 6 must be obtained, and the positions of the optical axes of the two cameras 17, 19 must be determined.

Figure 4A:
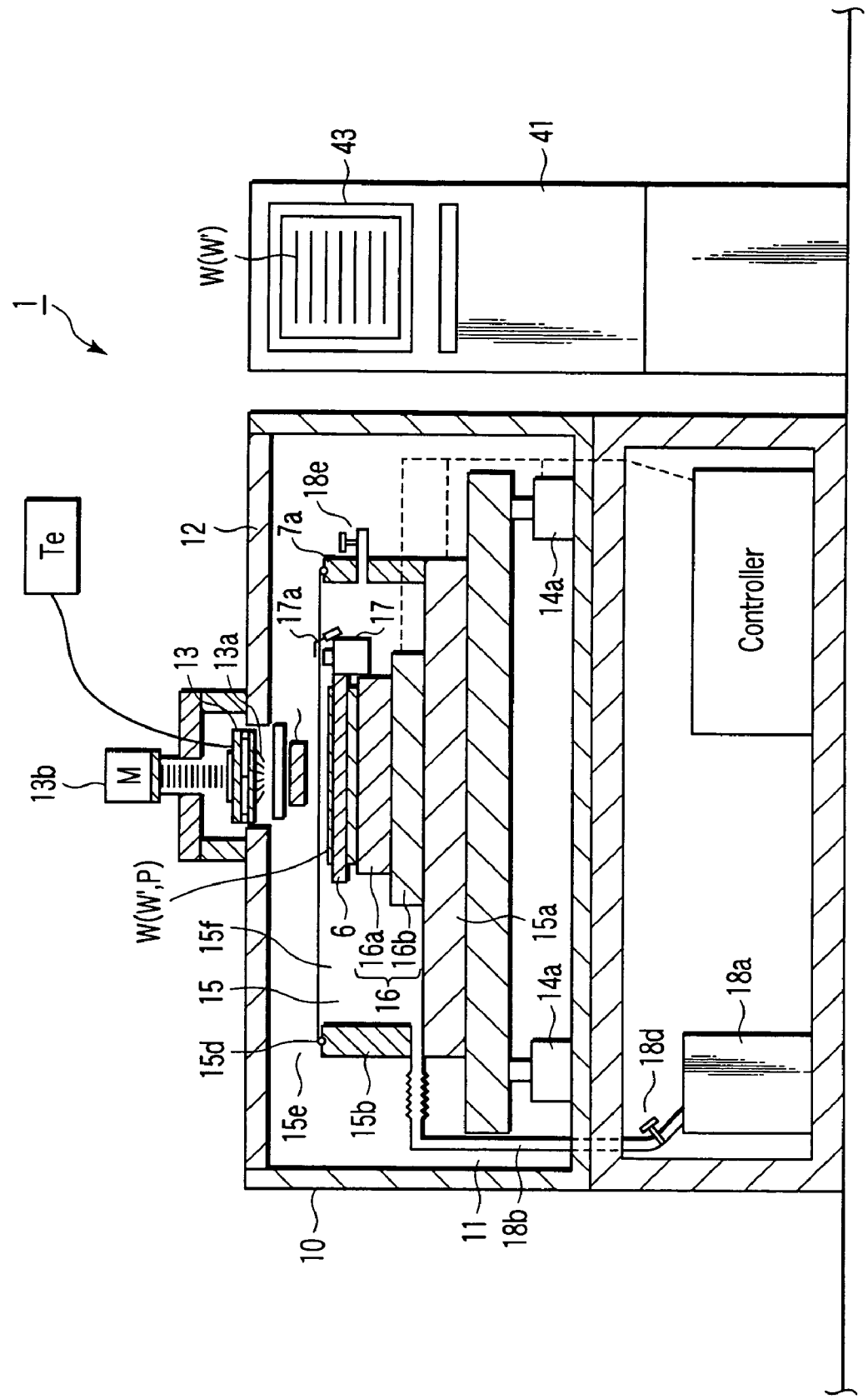
FIG. 4A is a view showing a state wherein, in a vacuum probe method using the vacuum prober according to the second embodiment of the present invention, the upper camera is moved into a recessed chamber.

For this purpose, as shown in FIG. 4A, the first moving mechanism 14*a* moves the stage 14 downward to separate the side portion 15*b* of the recessed chamber 15 from the lower surface of the head plate 12. In this state, a gap 15*e* is formed between the side portion 15*b* and head plate 12. An object W' to be tested can be loaded in and unloaded from the table 6 by utilizing this gap. This gap can also be used as an opening/closing portion 15*e* through which the upper camera 19 moves between the outside and inside of the recessed chamber 15.

The upper camera 19 is moved in the directions of the arrows so that it is positioned below the center of the probes 13a.

Figure 4B:
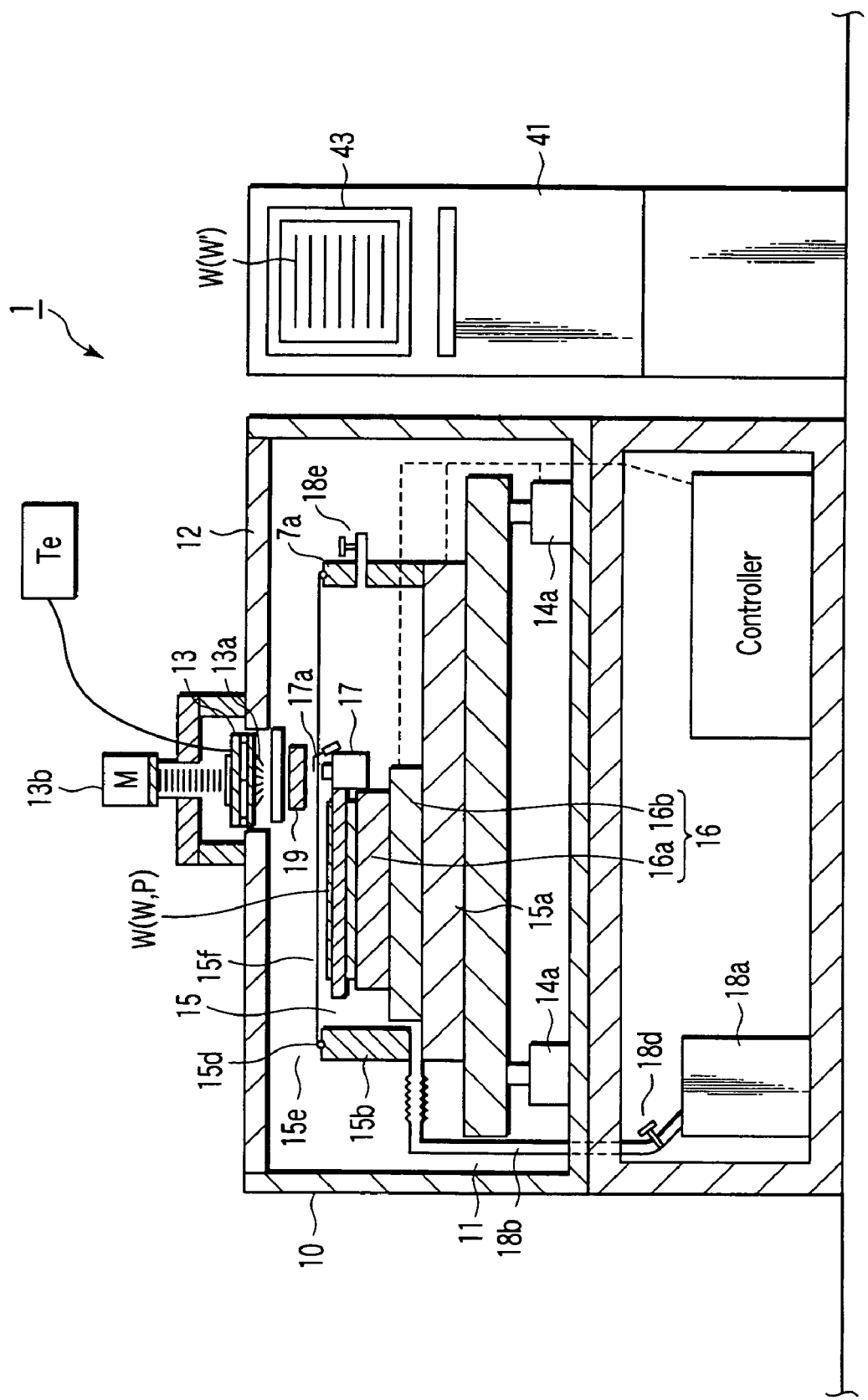
FIG. 4B is a view showing, in the vacuum probe method using the vacuum prober according to the second embodiment of the present invention, operation of causing the optical axis of the upper camera and that of a lower camera to coincide.

Subsequently, as shown in FIG. 4B, the table 6 is moved so that the optical axes of the upper and lower cameras 19 and 17 coincide. For this purpose, for example, the following scheme can be employed. More specifically, the upper and lower cameras 19 and 17 are focused on a target 17a, so that the optical axes of the two cameras 19 and 17 coincide. The relationship between the positions of the table 6 and those of the optical axes of the two cameras 17 and 19 can be determined from the position of the table 6 as the optical axes of the two cameras 17 and 19 coincide.

Figure 4C:
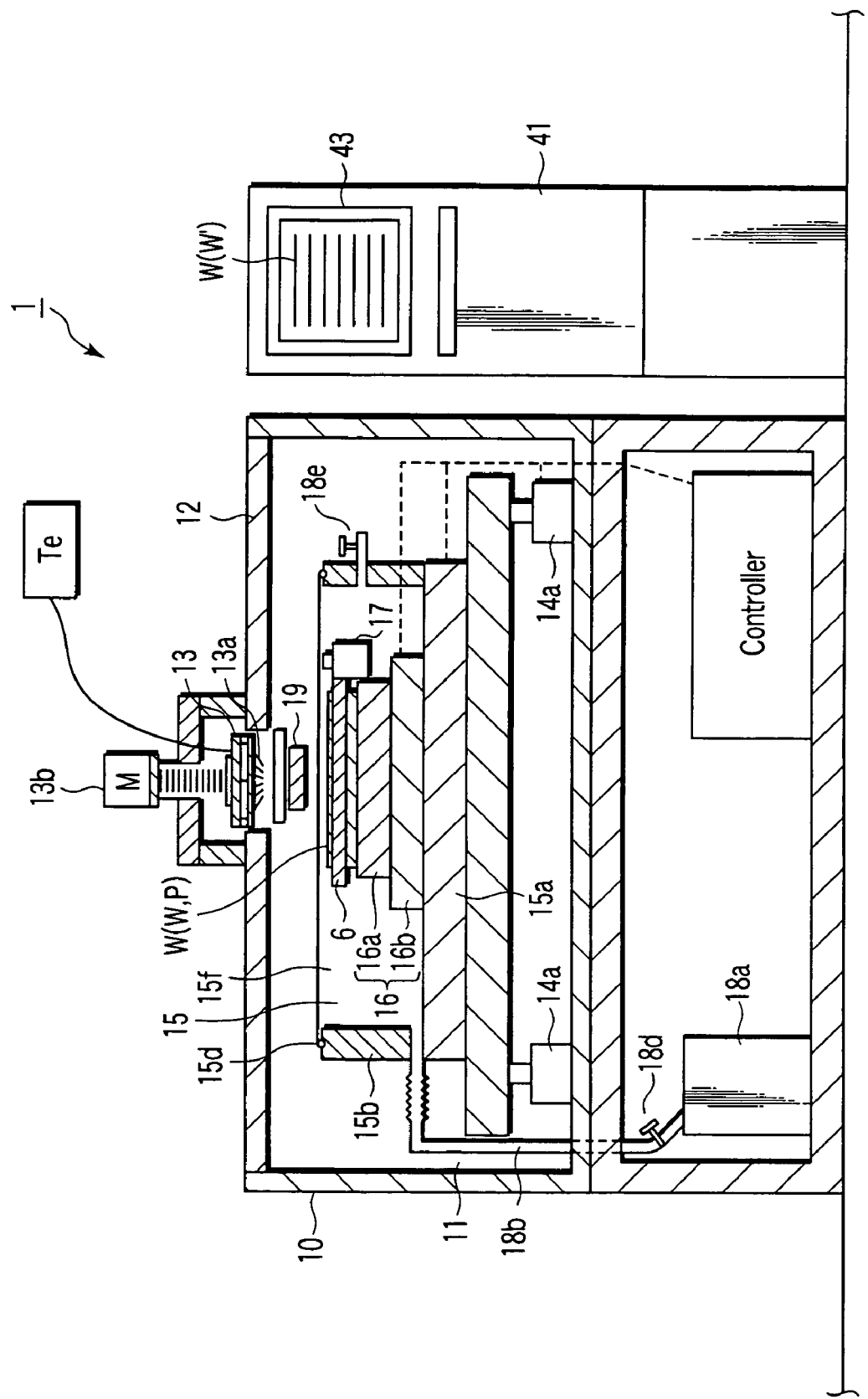
FIG. 4C is a view showing, in the vacuum probe method using the vacuum prober according to the second embodiment of the present invention, operation of measuring the position of an object to be tested.

For the alignment, it is also necessary to obtain the position of the object W' to be tested placed on the table 6. For this purpose, for example, the following scheme can be employed. More specifically, while the upper camera 19 is stopped at a position below the center of the probes 13a, the table 6 is moved in the X, Y, and θ directions, as shown in FIG. 4C. A predetermined electrode P of the object W' to be tested can be imaged by the upper camera 19. The position of the object W' to be tested can be calculated from the imaging position.

For the alignment, it is also necessary to obtain the position of the needle point of the probe 13a. For this purpose, the needle point of the probe 13a are moved downward by the third moving mechanism 13b to a position where the lower camera 17 can image the needle point of a predetermined probe 13a. In this state, the table 6 is moved in the X and Y directions to calculate the X-, Y-, and Z-coordinates of the needle point of the probe.

The above position measurement of the predetermined probe 13a is performed by establishing an atmospheric environment in the recessed chamber 15.

According to the second embodiment, when the recessed chamber 15 is a vacuum chamber 15", the electrical characteristics of the object W' to be tested arranged in the vacuum chamber 15" can be measured in the vacuum environment. If the recessed chamber 15 is not evacuated but an atmospheric environment is established in it, measurement in the atmospheric environment can also be performed.

The second embodiment can also include a temperature control mechanism which heats/cools the object W' to be tested.

An example of a method of testing the electrical characteristics of the object W' to be tested by utilizing the vacuum prober 1 shown in FIG. 2 will be described with reference to FIGS. 4A to 4D.

(A) The vacuum prober 1 is opened to the atmosphere. In the sealed state shown in FIG. 2, the stage 14 is moved downward by using the first moving mechanism 14a. Consequently, as shown in FIG. 4A, the upper end 15g of the side portion 15b of the recessed chamber 15 separates from the lower surface of the head plate 12, to open the recessed chamber 15. An upper opening 15f of the recessed chamber 15 separates from the lower surface of the head plate 12, and the gap 15e is formed between the upper end 15g of the side portion 15b of the recessed chamber 15 and the head plate 12. In this state, an object W' to be tested W' (e.g., a device W' formed on a wafer) is placed on the table 6.

(B) The upper camera 19 is moved upward in the recessed chamber 15 through the gap 15e between the recessed chamber 15 and head plate 12, so that the upper camera 19 is positioned below the center of the probes 13a.

(C) As shown in FIG. 4B, the table 6 is moved to position the lower camera 17 under the upper camera 19. The focal points of the upper and lower cameras 19 and 17 are set on the target 17a, so that the optical axes of the two cameras 19 and 17 coincide. The positions of the optical axes of the two cameras 19 and 17 can be determined from the position of the table 6 as the optical axes of the two cameras 19 and 17 coincide. At this time, the reference position of the table 6 can also be determined.

(D) As shown in FIG. 4C, while the upper camera 19 stays still below the center of the probes 13a, a predetermined electrode P of the object W' to be tested formed on the wafer W is imaged by the upper camera 19. The X-, Y-, and Z-coordinates of the object W' to be tested are calculated from the imaging position.

(E) The upper camera 19 is retreated upward outside the recessed chamber 15.

Figure 4D:
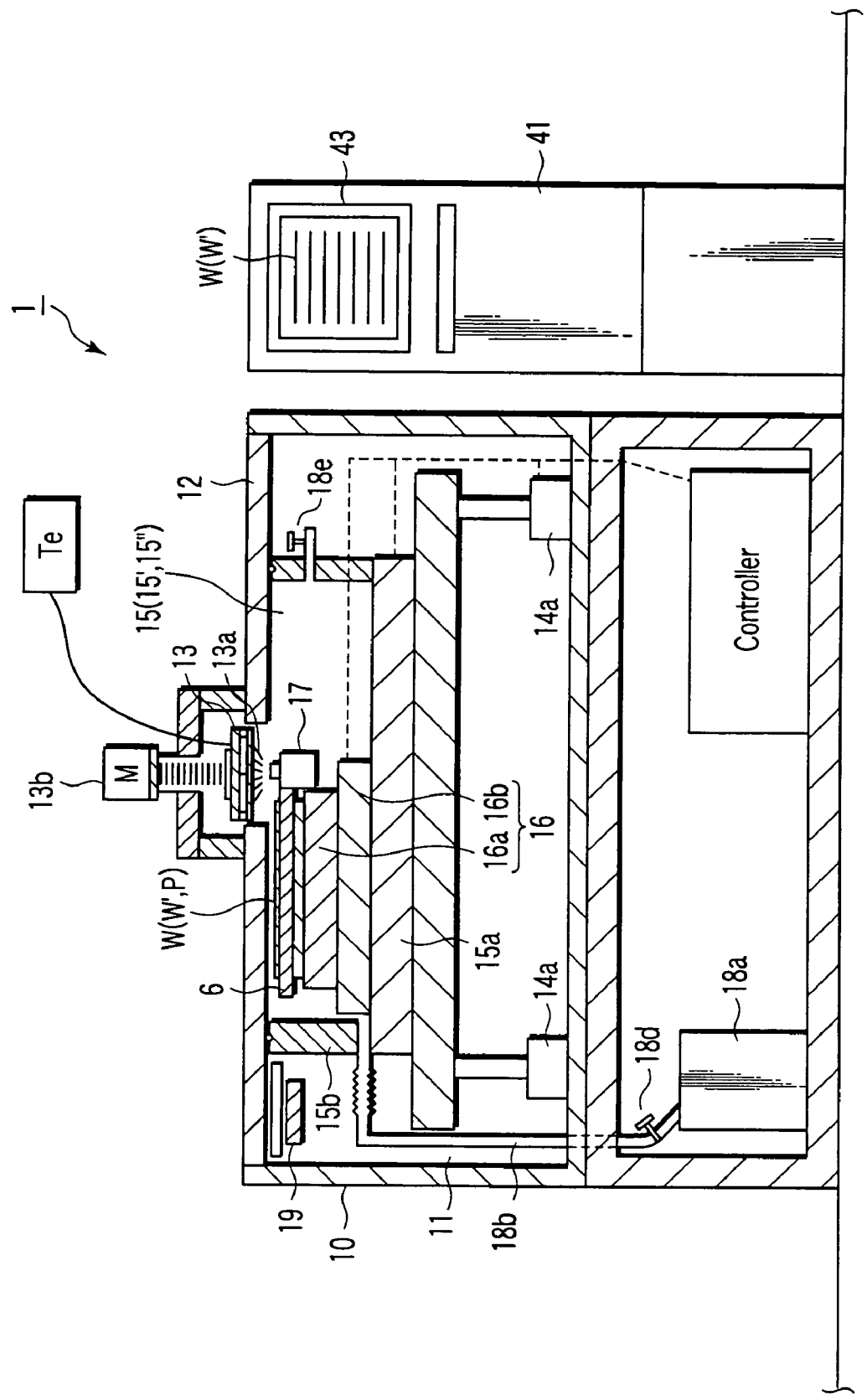
FIG. 4D is a view showing, in the vacuum probe method using the vacuum prober according to the second embodiment of the present invention, operation of measuring the positions of the probes of a probe card.

(F) As shown in FIG. 4D, the first moving mechanism 14a moves the stage 14 upward to bring the upper end 15g of the side portion 15b into tight contact with the lower surface of the head plate 12. With this upward movement, the recessed chamber 15 becomes the sealed chamber 15'. The table 6 is moved by the second moving mechanism 16 to position the lower camera 17 below the probe card 13.

(G) The height of the probe card 13 is adjusted by the third elevating mechanism 13b, so that the distal end of a predetermined probe 13a of the probe card 13 is positioned at the focal position of the lower camera 17. The lower camera 17 photographs the needle point of a predetermined probe 13a. The X- and Y-coordinates and Z-direction coordinate of the needle point of the probe 13a are calculated from the X- and Y-direction positions of the table 6 and the Z-direction position of the probe card 13 at this time.

The above coordinate measurement of the needle point of the probe 13a can be performed by establishing an atmosphere in the sealed chamber 15'. Alternatively, to perform measurement in a state close to an actual measurement environment, the sealed chamber 15' may be evacuated by the vacuum pump 18a, so that measurement is performed in the vacuum environment.

(H) The sealed chamber 15' is evacuated by the vacuum pump 18a, so that the sealed chamber 15' becomes a vacuum chamber 15". Regarding the time necessary for the evacuation, as the capacity of the sealed chamber 15' is small, evacuation can be ended within a short time corresponding to the capacity.

Figure 4E:
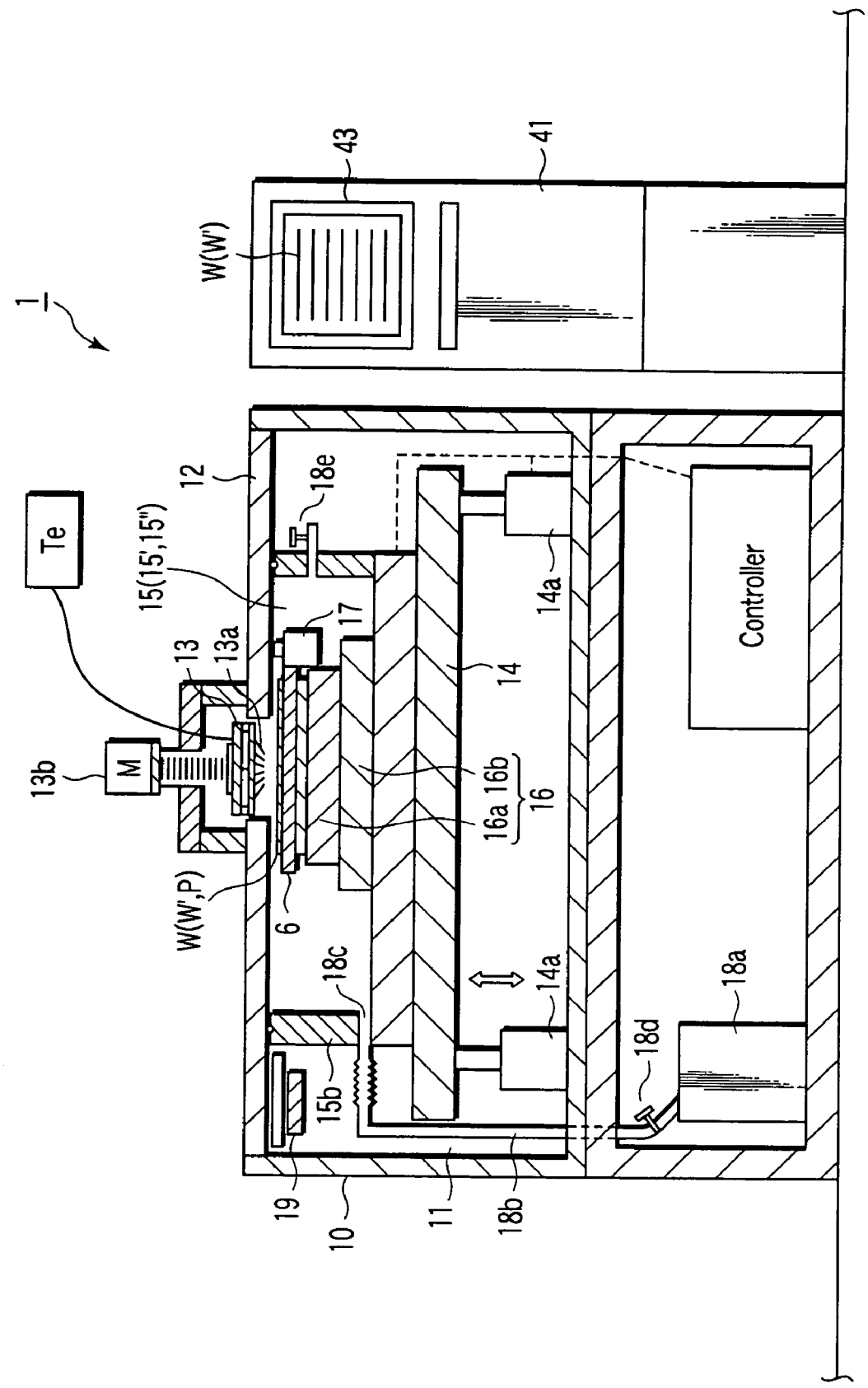
FIG. 4E is a view showing, in the vacuum probe method using the vacuum prober according to the second embodiment of the present invention, operation of testing the electrical characteristics of the object to be tested.

(I) In the state shown in FIG. 4E, the probe card 13 is moved downward by the third moving mechanism 13b. The probes 13a of the probe card 13 are brought into contact with the electrodes P of the object W' to be tested. Then, the probe card 13 is overdriven to connect the probes 13a and the electrodes P electrically to each other.

(J) While the state wherein the probes 13a and the electrodes P are electrically connected to each other, the tester Te sends a measurement signal to the electrodes P through the probes 13a, to test the electrical characteristics of the object W' to be tested.

(K) The probe card 13 is moved upward by the third moving mechanism 13b. The table 6 is moved so that the next object W' to be tested comes to the measurement position. The probe card 13 is then moved downward again. Testing is performed in the same manner as in (I) and (J) described above. This operation is repeated.

(L) The electrical characteristics of all the objects W' to be tested which are formed on the wafer W and require testing are tested. After that, the vacuum chamber 15" is opened to the atmosphere via the atmospheric open pipe 18e. The second moving mechanism 14a moves the stage 14 downward to open the recessed chamber 15 (FIG. 4A). In this state, the wafer W on the table 6 is exchanged for the next wafer W.

Above steps (B), (C), (D), (E), (F), and (G) can be performed in accordance with any one of the order of (B), (C), (D), (E), (F), and (G), the order of (B), (C), (E), (F), (G), (B), (D), and (E), the order of (B), (D), (C), (E), (F), and (G), and the order of (B), (D), (E), (F), (G), (B), (C), (E), and (F).

The electrical characteristics of the objects W' to be tested formed on the new wafer W can be tested sequentially by repeating (I) to (K).

The third embodiment of the present invention will be described with reference to FIG. 5.

A vacuum prober 1 according to the third embodiment has a prober chamber 11. A stage 14 is arranged in the prober chamber 11. A first moving mechanism 14a moves the stage 14 in the X, Y, and Z directions.

A contact holding mechanism (e.g., a probe card) 13 and upper camera 19 can be provided in the upper portion of the prober chamber 11. The contact holding mechanism 13 has a plurality of contacts 13a. The upper camera 19 images downward. As the contacts 13a, bump-like contacts, needle-like probes, or the like can be employed (the contacts will be referred to as "probes" hereinafter). In the second embodiment, a case in which a probe card 13 having a plurality of probes 13a is employed will be described, but the present invention is not limited to this case. The probe card 13 having the probes 13a is vertically moved in the Z direction by a third moving mechanism 13b.

The contact holding mechanism 13 is preferably arranged inside a sealing member 12a.

The upper camera 19 can be fixed to a head plate 12, as shown in FIG. 5. Preferably, the upper camera 19 has a mechanism that can move in the X and/or Y direction by using, e.g., the alignment bridge 19b shown in FIG. 3.

Referring back to FIG. 5, a recessed chamber 15 is formed on the stage 14. The recessed chamber 15 has a bottom portion 15a and side portion 15b. The stage 14 shown in FIG. 5 also serves as the bottom portion 15a of the recessed chamber 15. Alternatively, the stage 14 and bottom portion 15a can be separate members, as shown in FIG. 2.

A table 6, second moving mechanism 16, lower camera 17, exhaust port 18c of a pipe 18b, and atmospheric open pipe 18e with a valve (see FIG. 2) can be provided in the recessed chamber 15. A wafer W is to be placed on the table 6. The second moving mechanism 16 moves the table 6 in the X and Y directions and the θ direction. The lower camera 17 images upward. The pipe 18b is connected to a vacuum pump 18a. As the pipe 18b, one with a stretchable, deformable structure (e.g., a bellows structure) can be employed. The lower camera 17 can be formed to move together with the recessed chamber 15 in the X, Y, and Z directions.

The upper and lower cameras 19 and 17 constitute an alignment mechanism which accurately aligns the plurality of probes 13a of the probe card 13 and the plurality of electrodes P on the wafer W with each other. The probe card 13 is arranged above the table 6. The wafer W is placed on the table 6. In the third embodiment, the upper and lower cameras 19 and 17 operate in an atmospheric environment, and accordingly do not particularly stand a vacuum environment.

When the first moving mechanism 14a moves the stage 14 upward, an upper end 15g of the side portion 15b of the recessed chamber 15 comes into tight contact with the lower surface of the sealing member 12a fixed to the head plate 12. The sealing member 12a serves as a lid member that seals an upper opening 15f of the recessed chamber 15. Alternatively, the head plate 12 may be formed such that its lower surface serves as the sealing member 12a, as shown in FIG. 2.

As the upper end 15g of the side portion 15b and the lower surface of the sealing member 12a come into tight contact with each other, the recessed chamber 15 becomes a sealed chamber 15'. The sealed chamber 15' is evacuated by the vacuum pump 18a to become a vacuum chamber 15". In the vacuum chamber 15", the table 6 can move in the X, Y, and θ directions to perform testing. Thus, once the vacuum chamber 15" is formed, the electrical characteristics of all objects W' to be tested formed on one wafer W can be tested without opening the vacuum chamber 15".

In the vacuum prober 1 shown in FIG. 5, the upper end 15g of the side portion 15b is in direct tight contact with the lower surface of the sealing member 12a. This upper end 15g and/or the lower surface of the sealing member 12a can be formed such that they come into tighter contact with each other. According to an example of this structure, a shield mechanism 15d is arranged at a portion into which the upper end 15g and/or the lower surface of the sealing member 12a comes into tight contact. As the shield mechanism 15d, apart from an O-ring, any shield mechanism 15d can be employed.

A test signal from a tester Te is applied to the electrodes P of the object to be tested W' formed on the wafer W through the probes 13a to test the electrical characteristics of the object to be tested W'. For this purpose, the probes 13a and corresponding electrodes P on the wafer W must be aligned with each other. For the alignment, first, the reference position of the table 6 must be obtained, and the positions of the optical axes of the two cameras 19 and 17 must be determined.

Figure 6A:
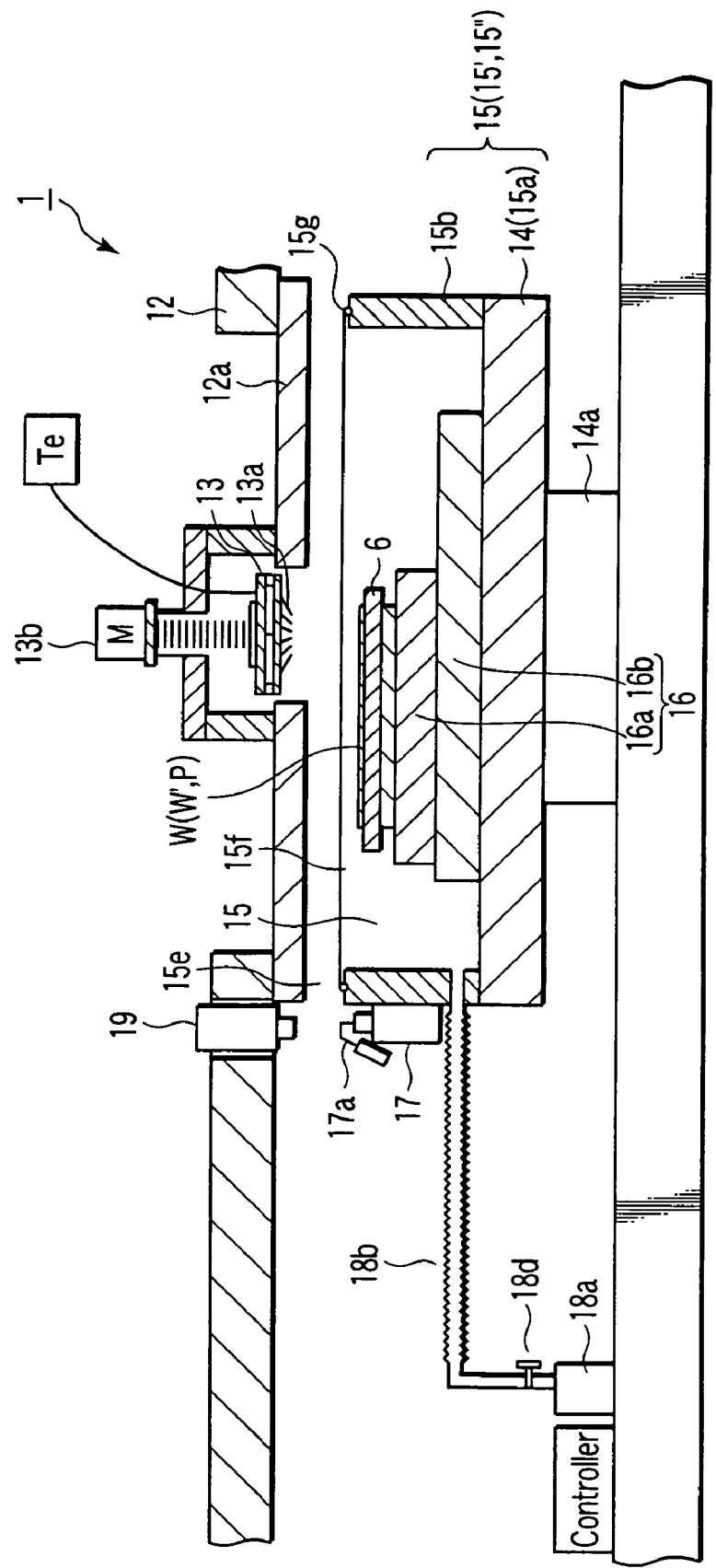
FIG. 6A is a view showing, in a vacuum probe method using a vacuum prober according to the third embodiment of the present invention, operation of causing the optical axis of the upper camera and that of a lower camera to coincide.

For this purpose, as shown in FIG. 6A, the first moving mechanism 14a moves the stage 14 downward to separate the side portion 15b of the recessed chamber 15 from the lower surface of the sealing member 12a. This movement will be described as "to open the recessed chamber 15 hereinafter. The stage 14 is moved in the X and Y directions to position the lower camera 17 below the upper camera 19. The optical axes of the upper and lower cameras 19 and 17 are caused to coincide. For this purpose, for example, the following scheme can be employed. More specifically, the focal points of the upper and lower cameras 19 and 17 are focused on a target 17a, so that the optical axes of the two cameras 19 and 17 coincide. The reference position of the table 6 and the positions of the optical axes of the two cameras 19 and 17 can be determined from the position of the table 6 (or the stage 14) as the optical axes of the two cameras 19 and 17 coincide.

For the alignment, it is also necessary to obtain the position of the object W' to be tested placed on the table 6. For this purpose, the following scheme can be employed. More specifically, as shown in, e.g., FIG. 6B, the stage 14 is moved to below the upper camera 19. A predetermined electrode P of the object W' to be tested is imaged by the upper camera 19. The position of the object W' to be tested is calculated from the imaging position.

For the alignment, it is also necessary to obtain the position of the probe card 13. For this purpose, as shown in FIG. 6C, the first moving mechanism 14a moves the lower camera 17, together with the stage 14, below the probe card 13. In this state, the third moving mechanism 13b vertically moves the probe card 13 in the Z direction, so that the needle point of a predetermined probe 13a of the probe card 13 is positioned at the focal point of the lower camera 17.

Subsequently, the lower camera 17 is moved in the X and Y directions to align it with the needle point of the probe 13a. Then, the lower camera 17 photographs the needle point of the predetermined probe 13a. The Z-, X-, and Y-coordinates of the needle point of the probe 13a are calculated from the Z-direction position of the probe card 13 and the X- and Y-direction positions of the table 6.

An example of a method of testing the electrical characteristics of the object W' to be tested by utilizing the vacuum prober 1 according to the third embodiment will be described with reference to FIGS. 6A to 6C.

(A) In the sealed state shown in FIG. 5, the stage 14 is moved downward by using the first moving mechanism 14a. Consequently, as shown in FIG. 6A, the upper end 15g of the side portion 15b of the recessed chamber 15 separates from the lower surface of the sealing member 12a to open the recessed chamber 15. The upper opening 15f of the recessed chamber 15 separates from the lower surface of the sealing member 12a, and a gap 15e is formed between the upper end 15g of the side portion 15b of the recessed chamber 15 and the sealing member 12a. In this open state, an object W' to be tested (e.g., a device W' formed on a wafer) is placed on the table 6.

(B) The stage 14 is moved to position the lower camera 17 below the upper camera 19.

(C) The upper and lower cameras 19 and 17 are focused on the target 17a, so that the optical axes of the two cameras 19 and 17 coincide. The positions of the optical axes of the two cameras 19 and 17 can be determined from the position of the table 6 as the optical axes of the two cameras 19 and 17 coincide. At this time, the reference position of the table 6 can also be determined.

Figure 6B:
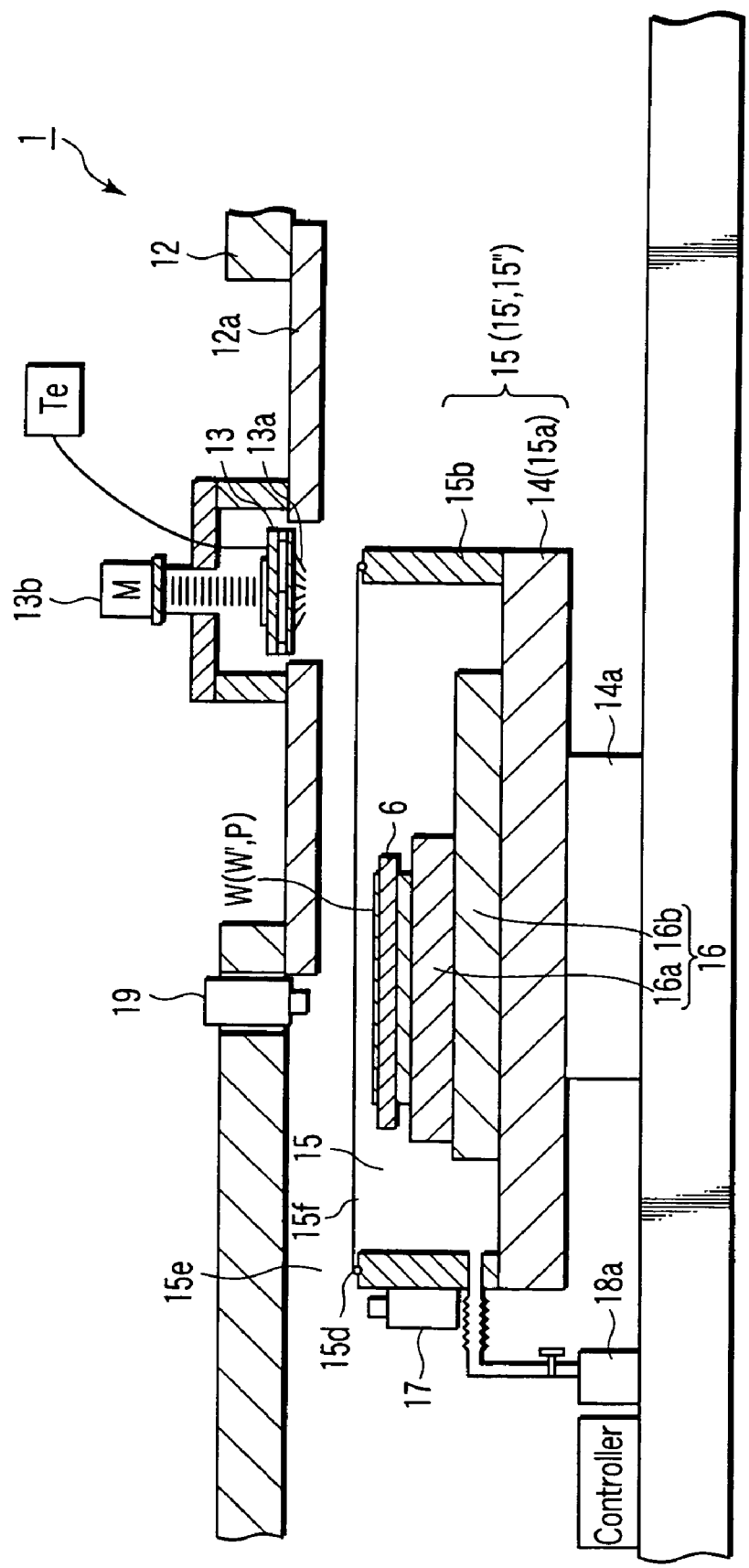
FIG. 6B is a view showing, in the vacuum probe method using the vacuum prober according to the third embodiment of the present invention, operation of measuring the position of an object to be tested.
Figure 6C:
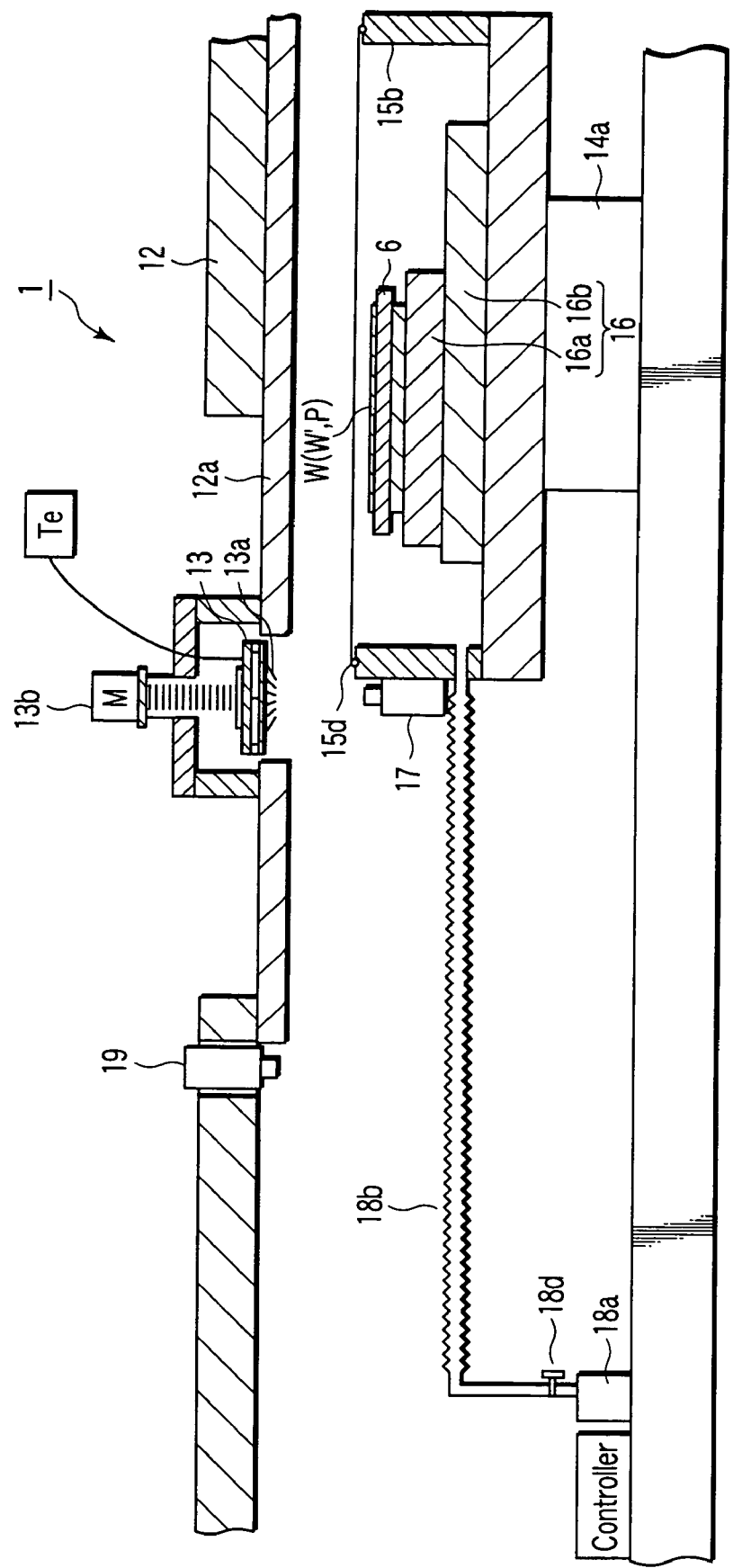
FIG. 6C is a view showing, in the vacuum probe method using the vacuum prober according to the third embodiment of the present invention, operation of measuring the positions of the probes of a probe card.

(D) As shown in FIG. 6B, the stage 14 is moved, to move the table 6, positioned at substantially the center of the recessed chamber 15, below the upper camera 19. Subsequently, the table 6 is moved by the second moving mechanism 16 to align a predetermined electrode P of the object W' to be tested formed on the wafer W on the table 6 with the upper camera 19. In this state, the electrode P is imaged by the upper camera 19. The position of the object W' to be tested is calculated from the imaging position.

(E) As shown in FIG. 6C, the stage 14 is moved to position the lower camera 17 below the contacts 13a of the probe card 13.

(F) The height of the probe card 13 is adjusted by the third moving mechanism 13b, so that the distal end of a predetermined probe 13a of the probe card 13 is positioned at the focal point of the lower camera 17. The lower camera 17 images the needle point of the predetermined probe 13a. The X- and Y-coordinates and the Z-direction coordinate of the needle point of the probe 13a are calculated from the X- and Y-direction positions of the table 6 and the Z-direction position of the probe card 13 at this time.

(G) The recessed chamber 15 is moved in the X and Y directions by the first moving mechanism 14a to position the table 6 below the probe card 13.

Figure 6D:
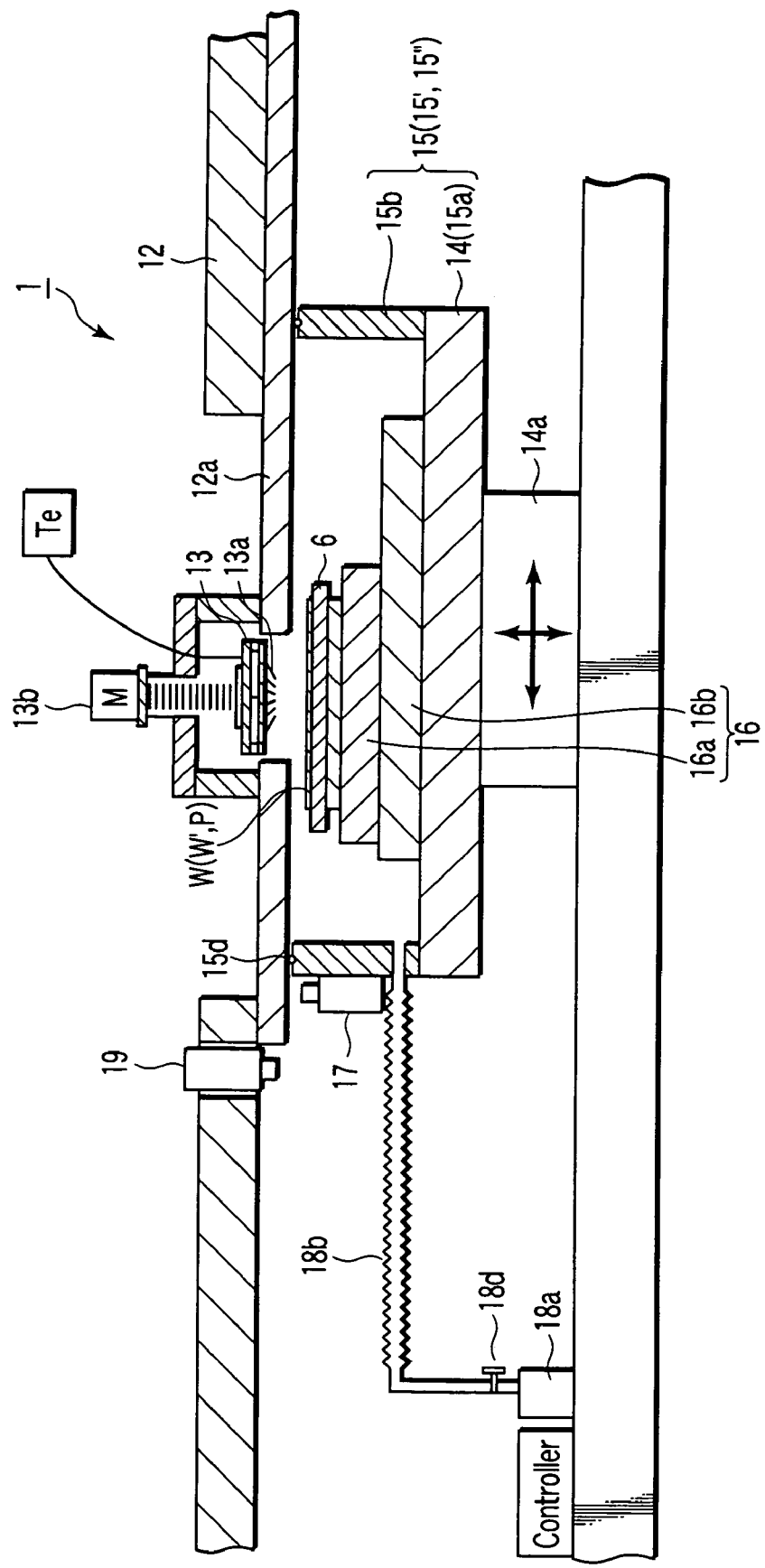
FIG. 6D is a view showing, in the vacuum probe method using the vacuum prober according to the third embodiment of the present invention, operation of testing the electrical characteristics of the object to be tested.

(H) As shown in FIG. 6D, the recessed chamber 15 is moved upward by the first moving mechanism 14a to bring the upper end 15g of the side portion 15b of the recessed chamber 15 into tight contact with the lower surface of the sealing member 12a. Thus, the interior of the recessed chamber 15 becomes a sealed chamber 15'.

(I) A valve 18d is opened. The sealed chamber 15' is evacuated by the vacuum pump 18, so that the sealed chamber 15' becomes a vacuum chamber 15". Regarding the time necessary for the evacuation, as the capacity of the sealed chamber 15' is small, evacuation can be performed in a short time.

(J) In the vacuum chamber 15", the contacts 13a and electrodes P of the object W' to be tested are aligned. The probe card 13 is moved downward by the third moving mechanism 13b. The probes 13a of the probe card 13 are brought into contact with the electrodes P of the object W' to be tested. Then, the probe card 13 is overdriven to connect the probes 13a and the electrodes P electrically to each other.

(K) While the probes 13a and the electrodes P are electrically connected to each other, the tester Te sends a measurement signal to the electrodes P through the probes 13a to test the electrical characteristics of the object W' to be tested.

(L) The contacts 13a are moved upward. The table 6 is moved to the next test position. Then, the contacts 13a are moved downward again.

(M) The table 6 is sequentially moved, and (J) and (M) are repeated to test the electrical characteristics of all objects W' to be tested which are formed on the wafer W and require testing.

(N) The electrical characteristics of all the objects W' to be tested which are formed on the wafer W are tested. After that, the first moving mechanism 14a moves the stage 14 downward to open the recessed chamber 15 (FIG. 6A). In this state, the wafer W on the table 6 is exchanged for the next wafer W.

The electrical characteristics of the object W' to be tested formed on the new wafer W can be tested sequentially by repeating the steps (A) to (M).

Steps (B), (C), (D), (E), and (F) are performed in accordance with any one of the order of (B), (C), (D), (E), and (F), the order of (B), (C), (E), (F), and (D), the order of (D), (B), (C), (E), and (F), and the order of (D), (E), (F), (B), and (C).

In the third embodiment of the present invention, when the stages 14 and 16 are moved, data on the positional relationship necessary for the alignment can be obtained. In this manner, according to the third embodiment of the present invention, both the upper and lower cameras 19 and 17 are arranged outside the recessed chamber 15. Thus, the upper and lower cameras 19 and 17 do not require a vacuum-resistant structure.

In the embodiments of the present invention, the table 6 needs to move in the X and Y directions in the vacuum chamber 15" (recessed chamber 15) only for the minimal amount necessary for testing. Thus, the capacity of the vacuum chamber 15" can be small. Consequently, the time necessary for evacuating the small-capacity vacuum chamber 15" can be shortened.

The table 6 can move in the vacuum chamber 15" in the X and Y directions to perform testing. Once the vacuum chamber 15" is formed, the electrical characteristics of all the objects W' to be tested formed on one wafer W can be tested without destroying the vacuum in the vacuum chamber 15".

In the third embodiment, the lower and upper cameras 17 and 19 are used only in the atmospheric environment, and are separate cameras. Consequently, the lower and upper cameras 17 and 19 need not have vacuum-resistant structures. The arrangement and structure of the two cameras 17 and 19 can be simplified.

In the present invention, although the vacuum chamber 15" is indispensable, the prober chamber 11 where the vacuum chamber 15" is to be arranged is not always necessary. The first embodiment shown in FIG. 2 and the third embodiment shown in FIG. 5 exemplify the vacuum prober 1 provided with the prober chamber 11.

The first moving mechanism 14a according to the present invention can support the stage 14 at a plurality of locations, as shown in FIG. 2, and can be formed of a plurality of mechanisms that move the stage 14. Alternatively, as shown in FIG. 5, one moving mechanism arranged at the center of the stage 14 can be employed.

As the contacts 13a of the present invention, bump-like contacts, needle-like probes, or the like can be employed.

The recessed chamber 15 according to the present invention can have the bottom portion 15a and side portion 15b, as shown in FIG. 2. Alternatively, the stage 14 can also serve as the bottom portion 15a, as shown in FIG. 5.

The recessed chamber 15 according to the present invention can have a square structure, as shown in FIGS. 2 and 3. The sectional shape of the recessed chamber 15 need not be square, and various types of structure, e.g., a circular body or elliptical body, can be employed. Preferably, the recessed chamber 15 may allow the table 6 to move smoothly and have the necessary minimal capacity to shorten the evacuation time (to be described later).

In FIGS. 2 and 5, the vacuum pump 18a according to the present invention is connected to the side portion 15b of the recessed chamber 15. Alternatively, the vacuum pump 18a can be connected to at least one of the bottom 15a of the recessed chamber 15 and the sealing member 12a.

According to the second and third embodiments of the present invention, the object W' to be tested is loaded in and unloaded from the recessed chamber 15 through the gap 15E formed between the upper end 15g of the side portion 15b of the recessed chamber 15 and the sealing member. According to the present invention, alternatively, a transporting gate valve 15d as shown in FIG. 1 may be provided. The object W' to be tested can be loaded in and unloaded from the recessed chamber 15 through the transporting gate valve 15d.

Similarly, according to the second embodiment of the present invention, the upper camera 19 is loaded in and unloaded from the recessed chamber 15 through the gap 15e formed between the upper end 15g of the side portion 15b of the recessed chamber 15 and the sealing member 12. According to the present invention, alternatively, a transporting gate valve 15h as shown in FIG. 1 may be provided. The upper camera 19 can be loaded in and unloaded from the recessed chamber 15 through the transporting gate valve 15h.

According to the embodiments of the present invention, the electrical characteristics of a plurality of objects W' to be tested can be tested in a once-formed vacuum environment without repeating the steps of formation of an atmospheric environment→formation of a vacuum environment→testing. According to the embodiments of the present invention, the internal capacity of the vacuum chamber 15" in the vacuum prober 1 can be decreased. According to the embodiments of the present invention, the evacuation time necessary for evacuating the vacuum chamber 15" can be shortened.

What is claimed is:

1. A vacuum prober for testing electrical characteristics of an object to be tested in a vacuum environment while each of a plurality of contacts are in contact with predetermined electrodes of the object to be tested, the vacuum prober comprising:
   a prober main body having a prober chamber;
   a recessed chamber arranged in the prober chamber of the prober main body;
   a table which is arranged in the recessed chamber and upon which an object to be tested is placed;
   a lower camera arranged either inside or outside the recessed chamber;
   an upper camera arranged at one of a position outside the recessed chamber and a position to oppose an interior of the recessed chamber; and
   a moving mechanism of the lower camera configured to move the lower camera,
   wherein the lower camera, while being positioned below the contacts, images the contacts, and the upper camera, while being positioned above the table in the recessed chamber, images the object to be tested.

2. A vacuum prober according to claim 1, wherein the upper camera is arranged outside the recessed chamber.

3. A vacuum prober for testing electrical characteristics of an object to be tested in a vacuum environment while each of a plurality of contacts are in contact with predetermined electrodes of the object to be tested, the vacuum prober comprising:
   a prober main body;
   a recessed chamber arranged in the prober main body;
   a table which is arranged in the recessed chamber and upon which an object to be tested is placed;
   a lower camera arranged either inside or outside the recessed chamber;
   an upper camera arranged at one of a position outside the recessed chamber and a position to oppose an interior of the recessed chamber; and
   a moving mechanism of the lower camera configured to move the lower camera,
   wherein the lower camera, while being positioned below the contacts, images the contacts, and the upper camera, while being positioned above the table in the recessed chamber, images the object to be tested, in which
   the recessed chamber which includes a bottom portion and a side portion, and which further includes:
   a sealing member which is independent of the recessed chamber to seal an upper opening of the recessed chamber;
   a first moving mechanism which moves the recessed chamber in a Z direction; and
   a vacuum mechanism connected to the recessed chamber,
   wherein when the first moving mechanism moves the recessed chamber in the Z direction to bring an upper end of the side portion of the recessed chamber into tight contact with a surface of the sealing member, the recessed chamber becomes a sealed chamber, and when a vacuum mechanism evacuates the sealed chamber, the sealed chamber becomes a vacuum chamber.

4. A vacuum prober according to claim 3, which further comprises a second moving mechanism which moves the table in at least one of X, Y and θ directions in the vacuum chamber, and
   in which the lower camera is provided on one of the table and second moving mechanism.

5. A vacuum prober according to claim 3, which further comprises a stage which supports the recessed chamber, and in which the first moving mechanism moves the stage in the Z direction to move the recessed chamber on the stage in the Z direction.

6. A vacuum prober according to claim 5, wherein the stage also serves as the bottom portion of the recessed chamber.

7. A vacuum prober according to claim 3, further comprising:
- a contact holding mechanism which is arranged on an upper portion of the vacuum prober main body and includes a plurality of contacts; and
- a third moving mechanism which vertically moves the contact holding mechanism,
- wherein the contact holding mechanism and third moving mechanism are hermetically attached to the sealing member.

8. A vacuum prober according to claim 3, wherein the lower camera is fixed to an outer wall of the recessed chamber.

9. A vacuum prober according to claim 8, further comprising a first moving mechanism configured to move the recessed chamber in the X, Y, and Z directions,
- wherein the first moving mechanism moves the recessed chamber in the Z direction to create a state wherein the upper end of the side portion of the recessed chamber is separate from the surface of the sealing member, and thereafter moves the recessed chamber in at least the X and Y directions to position the lower camera, fixed outside the recessed chamber, below the upper camera.

10. A vacuum prober according to claim 9, wherein the stage also serves as the bottom portion of the recessed chamber.

11. A vacuum prober according to claim 10, further comprising:
- a contact holding mechanism which is arranged on an upper portion of the prober main body and includes a plurality of contacts; and
- a third moving mechanism which vertically moves the contact holding mechanism,
- wherein the contact holding mechanism and third moving mechanism are hermetically attached to the sealing member.

12. A vacuum prober according to claim 9, which further comprises a stage which supports the recessed chamber, and in which the first moving mechanism moves the stage in the Z direction to move the recessed chamber on the stage in the Z direction.

* * * * *